(12) United States Patent
Gall et al.

(10) Patent No.: US 7,075,794 B2
(45) Date of Patent: Jul. 11, 2006

(54) ELECTRONIC CONTROL UNIT

(75) Inventors: Thomas P. Gall, Norhtbrook, IL (US); Kevin D. Moore, Hoffman Estates, IL (US); Timothy J. Trento, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/659,884

(22) Filed: Sep. 11, 2003

(65) Prior Publication Data

US 2005/0056457 A1    Mar. 17, 2005

(51) Int. Cl.
   *H05K 1/00*     (2006.01)
(52) U.S. Cl. ............ 361/749; 361/757; 361/795; 174/260; 174/261
(58) Field of Classification Search ........ 361/749–750, 361/795, 757, 760–720, 740, 730; 257/690–691; 174/260–261, 254–255
   See application file for complete search history.

(56) References Cited

U.S. PATENT DOCUMENTS

| | | | |
|---|---|---|---|
| 5,103,375 A | 4/1992 | Cottingham et al. | |
| 5,159,751 A | 11/1992 | Cottingham et al. | |
| 5,170,326 A * | 12/1992 | Meny et al. ............ | 361/736 |
| 5,179,501 A | 1/1993 | Ocken et al. | |
| 5,216,581 A | 6/1993 | Fisher et al. | |
| 5,265,322 A | 11/1993 | Fisher et al. | |
| 5,276,418 A | 1/1994 | Klosowiak et al. | |
| 5,434,362 A | 7/1995 | Klosowiak et al. | |
| 5,925,298 A * | 7/1999 | Walles et al. ........... | 264/139 |
| 5,969,945 A | 10/1999 | Cutting et al. | |
| 5,998,738 A | 12/1999 | Li et al. | |
| 6,292,370 B1 | 9/2001 | Anderson et al. | |
| 6,383,033 B1 | 5/2002 | Politsky et al. | |
| 6,483,037 B1 | 11/2002 | Moore et al. | |
| 6,485,310 B1 | 11/2002 | Soh | |
| 6,501,661 B1 | 12/2002 | Moore et al. | |
| 2002/0085665 A1 | 7/2002 | Hoffman et al. | |
| 2002/0151210 A1 | 10/2002 | Singh et al. | |

* cited by examiner

*Primary Examiner*—Kamand Cuneo
*Assistant Examiner*—Hung S. Bui
(74) *Attorney, Agent, or Firm*—Indira Saladi; Brian M. Mancini

(57) ABSTRACT

An electronic control unit having a flexible circuit board assembly is disclosed. The electronic control unit comprises a flexible circuit board with at least one layer having first and second portions separated by a bendable region. The electronic control unit further comprises a substantially rigid substrate having first and second portions separated by a bend region and inside and outside surfaces. The first and second portions of the circuit board are affixed to respective first and second portions of the substrate. The bend region has one of the group of a recess and aperture extending outwardly from the inside surface of the substrate with the one of the group of the recess and aperture sized to accept the bendable region of the circuit board.

18 Claims, 6 Drawing Sheets

ELECTRONIC CONTROL UNIT

FIELD OF THE INVENTION

The present invention relates generally to automotive electronic control units, and, in particular, to use of a flexible circuit that is bent in the assembly of an automotive electronic control unit.

BACKGROUND OF THE INVENTION

Control units for automotive engines are disposed in a confined space in an environment subject to high ambient temperatures and extreme vibrations. Typically, in order to enhance thermal performance and protection against engine vibrations, a printed circuit board that includes control circuitry is affixed to a rigidizer that may be bent to produce a reduced size module and that also functions as a heat spreader. For example, in an application using a printed circuit board that has a bent flexible circuit, as is used for packaging an electronic control unit, the printed circuit board is mounted to an aluminum rigidizer. The rigidizer provides mechanical support for the printed circuit board and assists in the dissipation of heat generated by components on the printed circuit board by conductively transferring the heat from the components to the underlying rigidizer.

Referring now to FIGS. 1 and 2, an electronic control unit (ECU) 100 of the prior art is illustrated. FIG. 1 is an isometric perspective of an end view of electronic control unit 100. FIG. 2 is a cross-sectional side view of electronic control unit 100. Electronic control unit 100 includes a flexible printed circuit board 104 that is affixed to a rigidizer 106 by use of an adhesive 202. Typically, circuit board 104 has a number of electronic components 102 mounted on the surface of the circuit board. Adhesive 202 is disposed between rigidizer 106 and printed circuit board 104 and functions to secure the printed circuit board to the rigidizer. After being secured to the flat rigidizer, the rigidizer and printed circuit board assembly is folded, resulting in a folded printed circuit board consisting of two main partitions 204, 208 at an angle to each other and connected by a serpentine bent section 206 having multiple tight radius bends 210 with a radius of curvature that is typically less than three millimeters (mm). For example, circuit board 104 may be bent using a Polybent™ process, as described in U.S. Pat. No. 5,998,738, the text of which is hereby incorporated by reference herein.

As the functionality of electronic control units has increased over time, the corresponding circuitry has become increasingly dense and complex. As a result, electronic control units have been migrating from the use of two-layer printed circuit boards, such as printed circuit board 104, to the use of four-layer printed circuit boards. One result of the manufacturing process of four-layer printed circuit boards is a thicker flexible circuit 206, even when the flexible circuit remains a two-layer circuit. Due to the thicker flexible circuit 206, flexible circuit boards are now known to crack and split when bent, resulting a control module that must be discarded. The discarded control modules result in excessive manufacturing costs and waste, especially since the printed circuit boards must be populated with components before being folded.

One solution has been to provide fewer layers in the circuit board at the bend section than in the flat sections. Another solution has been to heat the circuit board during bending. Both of these solutions require additional processing steps in either the manufacturing of the circuit board or the assembly of the electronic control unit.

Therefore, a need exists for a method and apparatus for providing a folding printed circuit board assembly that will not cause splitting and cracking of the flexible circuit.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, wherein:

DETAILED DESCRIPTION OF THE PREFERRED EMBODIMENT

Figure 1:
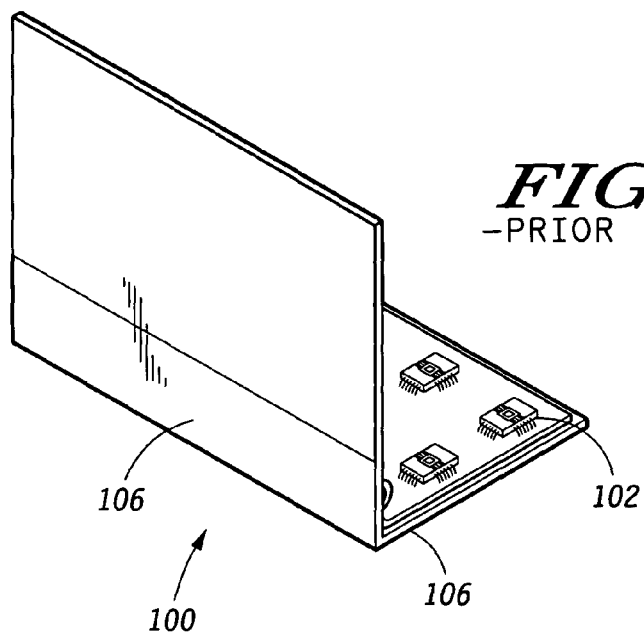
FIG. 1 is an isometric perspective of an end view of an electronic control unit of the prior art.
Figure 2:
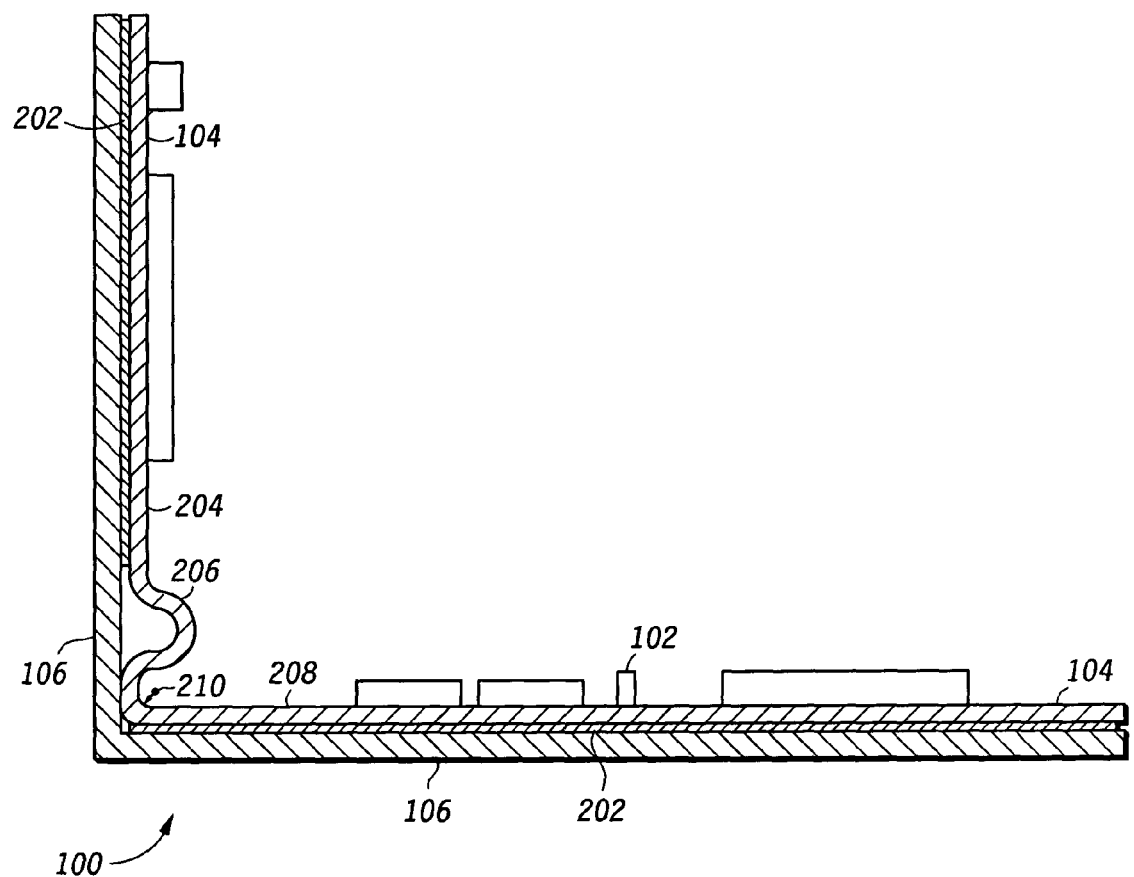
FIG. 2 is a cross-sectional perspective of a side view of the electronic control unit of FIG. 1.

The present invention provides a method and apparatus for folding a printed circuit board assembly of an electronic control unit that will not cause splitting and cracking of the flexible circuit. The electronic control unit (ECU) includes a flexible circuit board having a first portion interconnected to a second portion through a bendable region. The electronic control unit further includes a substantially rigid substrate (e.g. aluminum) or rigidizer that having a first portion interconnected to a second portion through a bend region. The respective first and second portion of the rigidizer and circuit board are bonded together as a flat assembly. When the ECU is then folded, the bendable region of the flexible circuit assumes a bend having a large radius, resulting in reduced cracking and splitting than in the prior art. In various embodiments of the present invention, the assumption of the large radius bend in the bendable region of the flexible circuit is facilitated by an aperture or recess in the bend region of the rigidizer.

Generally, one embodiment of the present invention encompasses an electronic control unit assembly system that includes a substantially rigid substrate or rigidizer having a first portion and a second portion separated by a bend region. The rigid substrate has an inside surface and an outside surface. The electronic control unit further includes a flexible circuit board having a first portion and a second portion separated by a bendable region. The bend region of the substrate includes a recess extending outwardly from the inside surface of the substrate with the recess sized to accept the bendable region of the circuit board. The first and second portions of the circuit board are affixed to the respective first and second portions of the substrate in a substantially flat configuration, such as through the use of an adhesive. The electronic control unit is folded at an angle of between zero and one-hundred-eighty degrees such that the inside surface of the rigidizer defines an interior region of the electronic control unit containing the circuit board. When folded, the bendable region of circuit board attains a shape with at least one large radius bend as a result of the folding by extending beyond the interior region of the rigidizer into the recess formed in the bend region of the substrate.

Another embodiment of the present invention encompasses an electronic control unit assembly system that includes a substantially rigid substrate or rigidizer having a first portion and a second portion separated by a bend region. The rigid substrate has an inside surface and an outside surface. The electronic control unit further includes a flexible circuit board having a first portion and a second portion separated by a bendable region. The bend region of the substrate includes an aperture extending between the inside surface and outside surface of the substrate with the aperture sized to accept the bendable region of the circuit board. The first and second portions of the circuit board are affixed to the respective first and second portions of the substrate in a substantially flat configuration, such as through the use of an adhesive. The electronic control unit is folded at an angle of between zero and one-hundred-eighty degrees such that the inside surface of the rigidizer defines an interior region of the electronic control unit containing the circuit board. When folded, the bendable region of circuit board attains a shape with at least one large radius bend as a result of the folding by extending beyond the interior region of the rigidizer into the aperture formed in the bend region of the substrate. This embodiment can include a cap to cover the aperture on the outside surface of the substrate. In addition, either of these embodiments can include a housing to affix to the substrate to form a sealed module containing the circuit board.

Another embodiment of the present invention encompasses a method for forming a circuit board in an electronic control unit assembly that includes providing a flexible circuit board having a first portion and a second portion separated by a bendable region and a substantially rigid substrate or rigidizer having a first portion and a second portion separated by a bend region. The method includes a step of forming an aperture or recess in the bend region of the substrate extending outwardly from an inside surface thereof with the aperture or recess sized to accept the bendable region of the circuit board. The method includes an additional step of affixing the first and second portions of the circuit board to the respective first and second portions of the substrate. This can include a substeps of applying an adhesive to the inside surface of the flat rigidizer and mounting the flexible circuit board flat on the surface of the rigidizer via the adhesive. The method further includes a step of bending the substrate at a junction of the first portion and the bend region of the substrate such that the bendable region of the circuit board deforms into the aperture or recess of the substrate.

Figure 3:
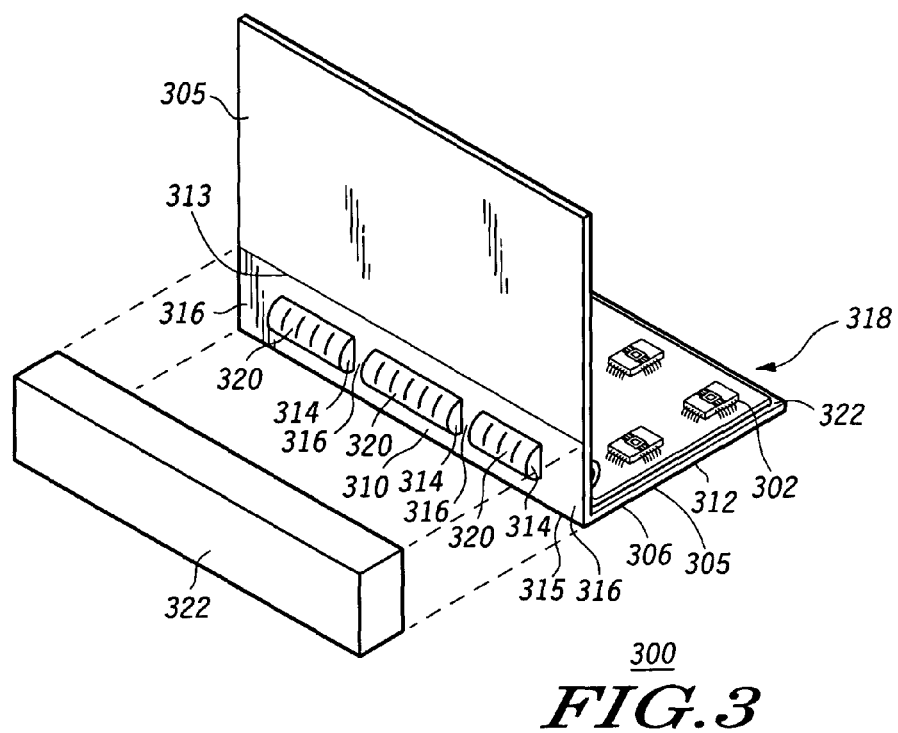
FIG. 3 is an isometric perspective of an end view of an electronic control unit in accordance with an embodiment of the present invention.
Figure 4:
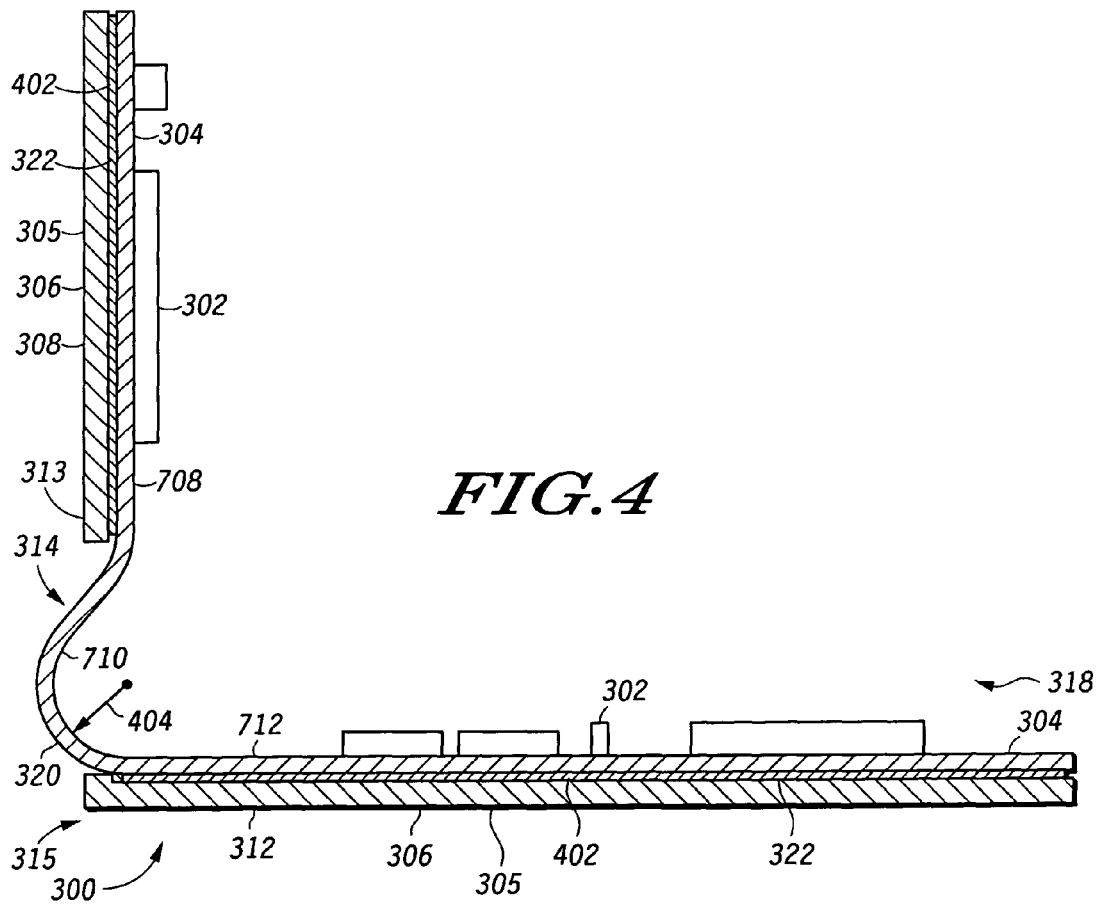
FIG. 4 is a cross-sectional perspective of a side view of the electronic control unit of FIG. 3 in accordance with an embodiment of the present invention.

Referring now to FIGS. 3 and 4, an exemplary electronic control unit 300 for housing a flexible circuit board is illustrated. FIG. 3 is an end view of electronic control unit 300 from an isometric perspective in accordance with an embodiment of the present invention. FIG. 4 is a cross-sectional side view of electronic control unit 300. Control unit 300 includes at least one electronic component 302, a circuit board 304, and a substantially rigid substrate (rigidizer) 306. Electronic component 302 represents any electronic components or devices that can be mounted to a printed circuit board such as, for example, a battery, a capacitor, a resistor, a semiconductor chip, a diode, an inductor, and a coil. Electronic component 302 is mounted onto a surface of circuit board 304, as illustrated in FIGS. 3 and 4. This can be accomplished by solder reflowing the parts to the flat circuit board before or during the assembly of the circuit board onto the rigidizer 306. Typically, circuit board 304 has a number of electronic components 302 mounted on the surface of the circuit substrate. These electronic components 302 are electrically connected to each other through a number of conductive pads or lands (not shown), conductive traces (not shown), and conductive vias (not shown) disposed on the surface and on or through internal layers of circuit board 304.

Preferably, circuit board 304 is a printed circuit board manufactured from any one of a number of materials known to one of ordinary skill in the art, such as epoxy glass, FR4, Resin Coated Copper, and polyimide. In one embodiment of the present invention, circuit board 304 is a flat sheet that is formed by conventional methods using multiple layers of a glass weave impregnated with an epoxy resin. Preferably three or more layers of epoxy glass are provided and four layers of circuitry. Circuit board 304 is secured to an inner surface 322 of rigidizer 306, which surface comprises an inner surface of the rigidizer when the circuit board and rigidizer are bent. Circuit board 304 is secured to surface 322 by an adhesive 402, which is preferably a pressure sensitive adhesive (PSA) tape or film. In another embodiment of the present invention, adhesive 402 may be a heat curable, liquid adhesive that is screen printed on the rigidizer 306. Those who are of ordinary skill in the art realize that there are many techniques for securing a circuit board 304 to surface 322, such as mechanical fasteners such as screws or other adhesive laminates that may be placed on surface 322, that may be used herein without departing from the scope of the present invention.

Rigidizer 306 surrounds circuit board 304 and is designed to shield circuit board 304 and electronic components 302 from electrical charge which can damage the circuit board and electronic components. The rigidizer 306 also provides mechanical support and conductively dissipates heat for circuit board 304. Preferably, the rigidizer 306 is manufactured from materials that are rigid enough to provide a rigid mechanical support for the circuit board 304, that is, to function as a rigidizer or stabilizer, and that have elements designed to shield the electronic components from heat, water, chemicals, and electrostatic charge, such as aluminum, copper, steel, engineering grade plastic, magnesium, and zinc or any material that is resistant to chemicals and elements commonly found in an automobile. Preferably rigidizer 306 is further manufactured from thermally conductive materials that transfer heat from components 302 during operation of electronic control unit 300, thereby assisting the components in dissipating the heat. However, those who are of ordinary skill in the art realize that electronic control unit 300 may be used in low power operations where thermal issues, and the thermal conductivity of rigidizer 306, may be of minor importance.

Circuit board 304 and rigidizer 306 are bent, or folded. As illustrated in FIGS. 3 and 4, circuit board 304 is bent into an approximate 'L' shape. However, any angle of greater than zero and less than one-hundred-eighty degrees can be used in the present invention. Preferably, circuit board 304 and rigidizer 306 are bent using a Polybent™ process, as described in U.S. Pat. No. 5,998,738, the text of which is hereby incorporated by reference herein. The Polybent™ process essentially takes a flat circuit board 304 and rigidizer 306 and folds the circuit board and rigidizer. While in one embodiment of the present invention circuit board 304 and rigidizer 306 are bent using a Polybent™ process, the circuit board and rigidizer may be bent using any technique known to one of ordinary skill in the art. The rigidizer can be bent at a first junction 315 along a major axis across the rigidizer between the first portion of the rigidizer and the bend region, a second junction 313 along another major axis across the rigidizer between the band region and the second portion, or both. Preferably, the rigidizer is bent at the first junction 315 between the first portion of the rigidizer and the bend region incorporating a bend of approximately ninety degrees, such that the bend region is substantially coplanar with a longer of the first and second portions of the substrate.

When the rigidizer 306 is bent, a first portion 312 of the rigidizer 306 is folded along the first junction 315 towards the second portion 308 of the rigidizer 306 to provide an angle of the inside surface 322 of less than one-hundred-eighty degrees. The first, second, and bend portions 312, 308 and 310 of the rigidizer 306 are configured to define an interior region 318 of the ECU 300. The bend region 310 of the rigidizer 306 includes at least one aperture 314 that facilitate a 'L'-shaped fold in circuit board 304 when the substrate and rigidizer are folded, and two side bridges 316 that interconnect the first portion 312 and second portion 308 of the rigidizer 306 across the bend region 310.

The aperture 314 allows for the bendable region 320 of the circuit board 304 to extend beyond interior region 318 of rigidizer 306 during the folding process, thereby allowing for an 'L'-shaped fold with a large radius in circuit board 304 instead of the prior art tight-radius serpentine 206 inside of the rigidizer 106 of electronic module 100. By allowing for an 'L'-shaped fold, the aperture 314 permits a larger radius of curvature 404 bend in the bendable region 320 of the flexible circuit portion of the circuit board 304 as compared to the radius of curvature 210 bend in a similarly-sized electronic module 100 of the prior art. The larger radius of curvature 404 bend, preferably a radius of curvature of not less than three millimeters, and preferable not less than five millimeters, greatly reduces the rate of splitting and cracking of the bendable region 320 when circuit board 304 is bent. Moreover, the unit 300 can be made with a lower profile by having a bend region of the rigidizer with a ten millimeter width between the first and second portions of the rigidizer. Electronic control unit 300 may also include an end cap 322 that can be secured over bend region 310 of the rigidizer 306 and bendable portion 320 of the flexible circuit 304 extending beyond interior region 318 of the folded rigidizer 306. The end cap 322 prevents elements such as dust, water, and other chemicals from entering rigidizer 306 via the aperture 314 and damaging the electronic components 302.

Figure 5:
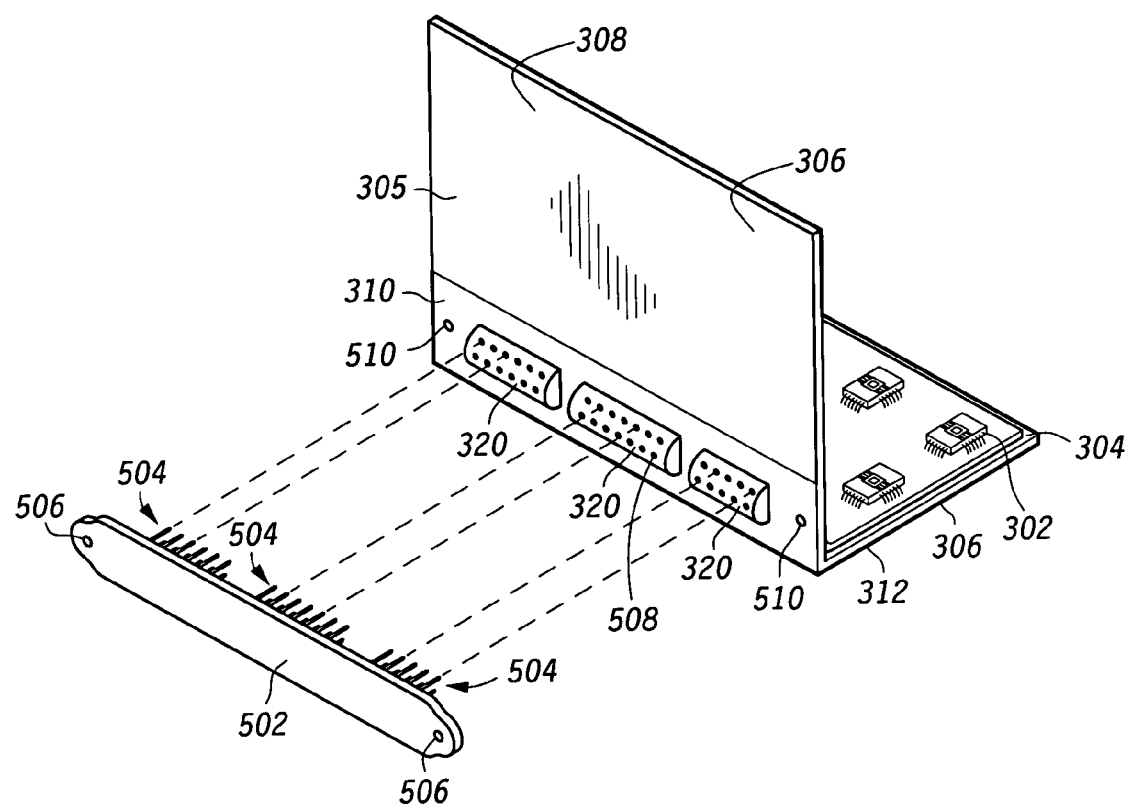
FIG. 5 is an isometric perspective of an end view of an electronic control unit in accordance with another embodiment of the present invention.

It should be recognized that a connector (not shown) could be mounted anywhere on the outside surface of the rigidizer 306 to electrically connect to the circuit board 304 through a hole in the rigidizer. For example, referring now to FIG. 5, a connector 502 can be connected to the bendable region 320 of the circuit board 304 extending beyond interior region 318 of the rigidizer 306 instead of an end cap 322. Connector 502 can include multiple electrically conductive pins 504 and multiple mating holes 506. In turn, the bendable region 320 of the circuit board 304 can include multiple connecting holes 508 for the purpose of receiving the multiple pins 504 of connector 502. The rigidizer 306 may also include multiple mating holes 510 that align with the multiple mating holes of the connector 502. Each of the multiple connecting holes 508 receives a pin of the multiple pins 504 when the assembly of electronic control unit 100 is completed, thereby providing an electrical interface, via connector 502, between circuit board 304 and external electronics. In addition, each of the multiple mating holes 506 in the connector 502 aligns with one of the multiple mating holes 510 of the rigidizer 306 for receiving a fastener that can hold the connector to the rigidizer and to the circuit substrate.

Figure 6:
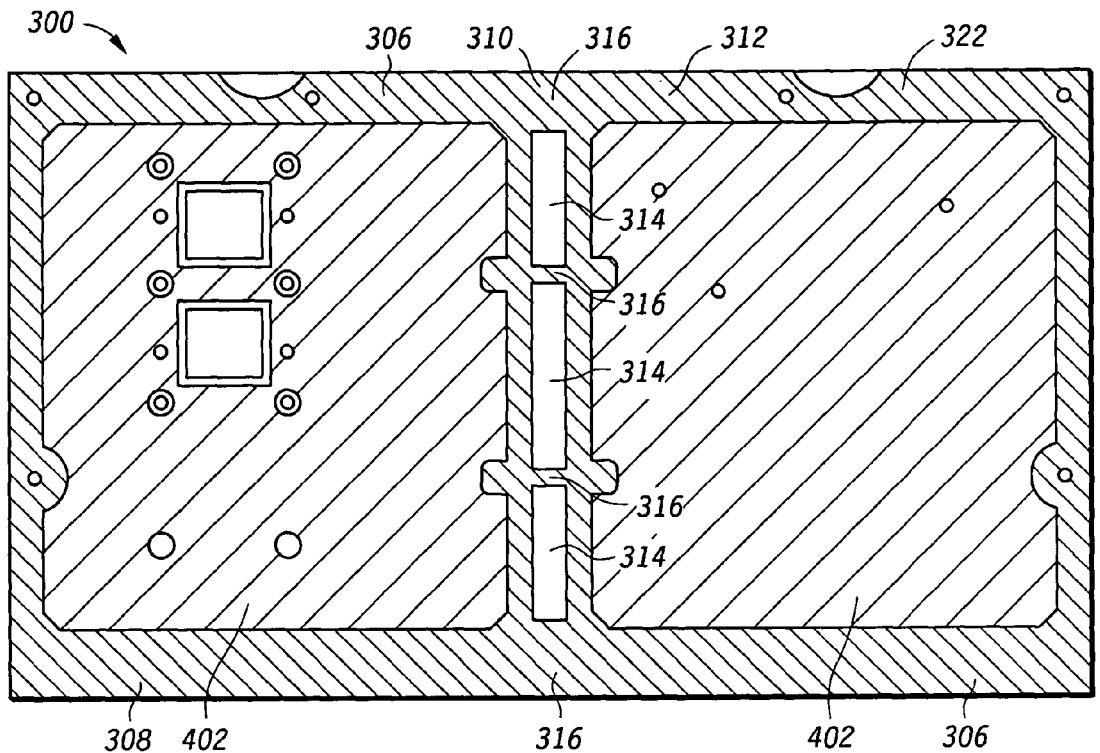
FIG. 6 is a top view of the rigidizer of FIG. 3, prior to being bent, with an adhesive applied to the rigidizer in accordance with an embodiment of the present invention.

FIG. 6 is a top view of the rigidizer 306 prior to being bent and with adhesive 402 applied to surface 322 of rigidizer 306 in accordance with an embodiment of the present invention. As depicted in FIG. 6, second portion 308 of the rigidizer 306 is interconnected to first portion 312 by the bridges 316 included in bend region 310. FIG. 6 further illustrates the aperture(s) 314 of the bend region 310 that facilitate an 'L'-shaped fold in circuit board 304 when the substrate and rigidizer are bent.

Figure 7:
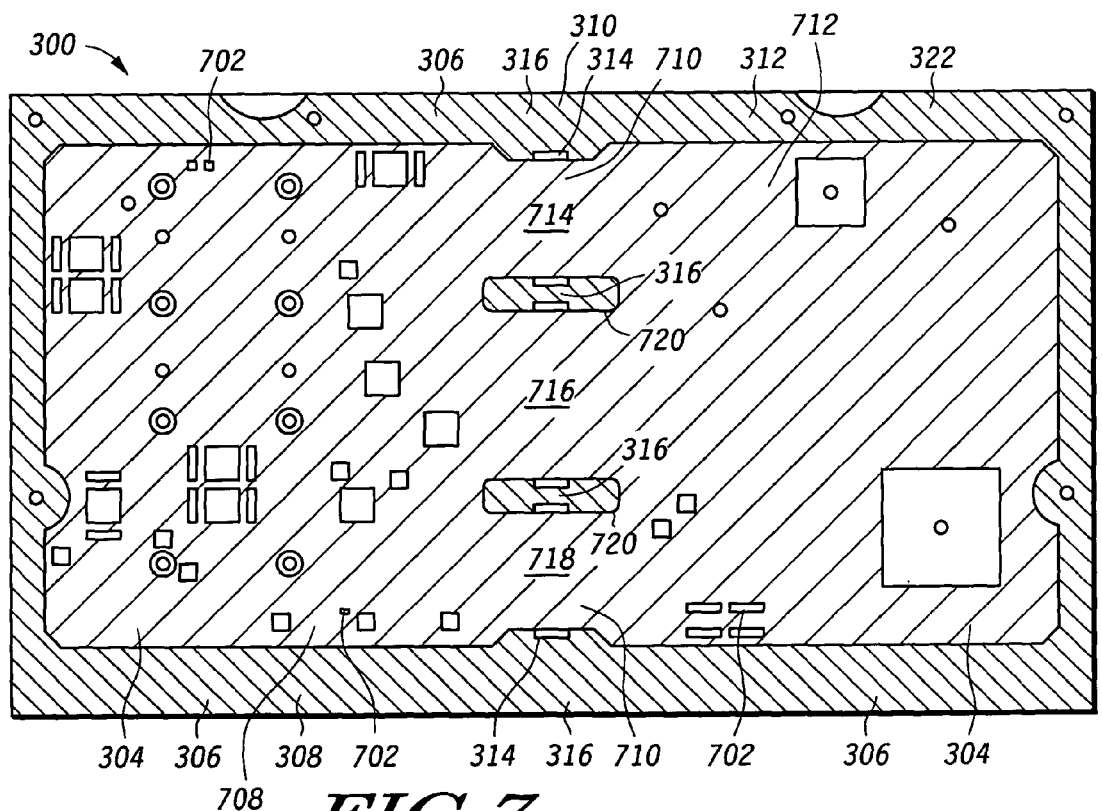
FIG. 7 is a top view of the electronic control unit of FIG. 3 prior to being bent and after a circuit board is mounted on the rigidizer and solder paste has been screened onto the circuit board in accordance with an embodiment of the present invention.

FIG. 7 is a top view of electronic control unit 300 after circuit board 304 is mounted flat on adhesive 402, and thereby on rigidizer 306, and after solder paste 702 has been screened onto the substrate in accordance with an embodiment of the present invention. Preferably components 302 are surface mountable components that may be auto-placed on circuit board 304. Those who are of ordinary skill in the art realize that components 302 need not be surface mountable. For example, components 302 may be through-hole parts that may be manually placed on circuit board 304. However, by using a liquid adhesive 402 that is screened on the rigidizer 306 and further using surface mountable components 302, a process of assembling electronic control unit 300 may be completely automated.

As depicted in FIG. 7, circuit board 304 includes a second portion 708 that is affixed to the second portion 308 of the rigidizer 306, a bendable regions of the flexible circuit 710 that is located (but not bonded) adjacent to bend region 310 of the rigidizer 306, and a first portion 712 that is affixed to the third portion 312 of the rigidizer 306. The bendable region partition 710 is shown divided into multiple sections 714, 716, and 718 that each overlay one of the multiple apertures 314 of the rigidizer 306, and further includes multiple cutout sections 720 that overlay each of the multiple bridges 316 of rigidizer 306. However, it should be recognized that a fewer or more bendable regions, apertures and cutouts could be provided.

Referring now to FIGS. 3, 4, and 7, when the circuit board 304 and the rigidizer 306 are folded, at least a portion of each of the three sections 714, 716, 718 of the bendable region 710 of the circuit board 304 extend into or through apertures 314, and thereby extend beyond the interior region 318 of the rigidizer 306. By allowing the circuit board 304 to extend beyond the interior region 318 when the substrate 304 and rigidizer 306 are folded, apertures 314 facilitate an 'L'-shaped folding of circuit board 304. The 'L'-shaped fold results in a larger radius of curvature 404 bend in the folded circuit board 304 than the radius of curvature 210 bend in the prior art serpentine-shaped, flexible circuit 206 of the prior art electronic control module 100, thereby reducing the cracking and splitting that occurs when flexible circuit 206 of the prior art module 100 is bent.

Figure 8:
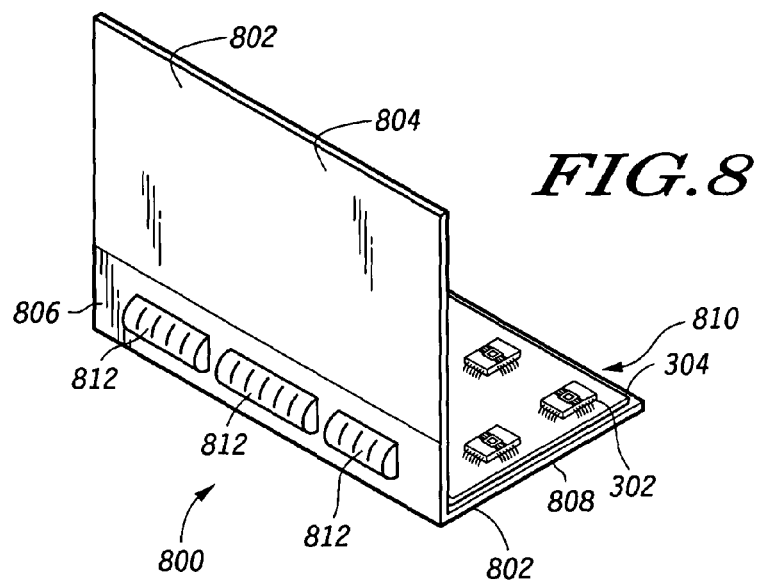
FIG. 8 is an isometric perspective of an end view of an electronic control unit in accordance with another embodiment of the present invention.
Figure 9:
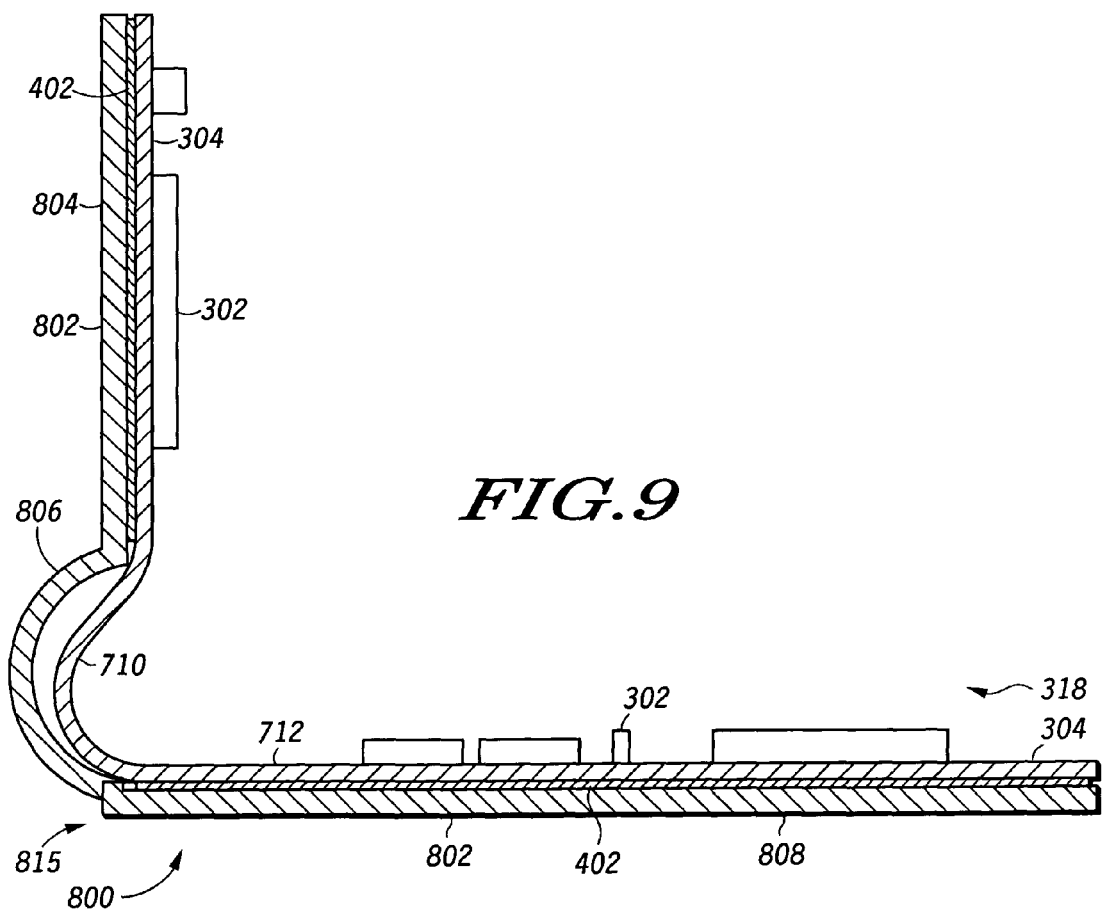
FIG. 9 is a cross-sectional perspective of a side view of the electronic control unit of FIG. 8 in accordance with another embodiment of the present invention.

Referring now to FIGS. 8 and 9, an electronic control unit 800 for housing a flexible circuit board is illustrated in accordance with a preferred embodiment of the present invention. FIG. 8 is an end view of electronic control unit 800 from an isometric perspective. FIG. 9 is a cross-sectional side view of electronic control unit 800. Similar to electronic control unit 300, electronic control unit 800 includes a circuit board 304 mounted to a rigidizer 802 and multiple components 302 mounted to circuit board 304. Also, similar to control unit 300, a folding of electronic control unit 800 results in a second portion 804 of the rigidizer 802 that is folded toward a first portion 808 of the rigidizer 802 along a first junction 815. The first and second portions 808 and 804 are interconnected by a bend region 806 of the rigidizer 802 that together with the first and third portions 808 and 804 defines an interior region 810 of the rigidizer 802.

However, instead of the aperture(s) 314 of the rigidizer 306 of FIGS. 3–7, the rigidizer 802 includes at least one recess 812 formed in the bend region 806 for receiving the 'L'-shaped fold in the circuit board 304 when the rigidizer 802 and the substrate 304 are bent. Preferably, the recess has a depth of five millimeters extending outwardly from the inner surface of the rigidizer. When the electronic control unit 800 is bent, bendable region 710 of circuit board 304 deforms and extends into the recess 812 to form a large-radius 'L'-shape rather than buckling into a serpentine shape. Moreover, the unit can be made with a lower profile by having a bend region of the rigidizer with a ten millimeter width between the first and second portions of the rigidizer. In addition, by providing the recess(es) 812 in the rigidizer 802 instead of the aperture(s) 314 the circuit board 304 may be completely contained in the rigidizer 802 after being bent and couple to a housing (not shown). By completely containing the circuit board 304, the rigidizer 802 is able to protect the circuit board 304 and the components 302 from elements such as dust, water, and other chemicals without the need for an end cap such as end cap 322 of FIG. 3. As before, a connector (not shown) can be provided anywhere on an outside surface of the unit and extending through the rigidizer or housing to connect to the circuit boards, using techniques known in the art.

Figure 10:
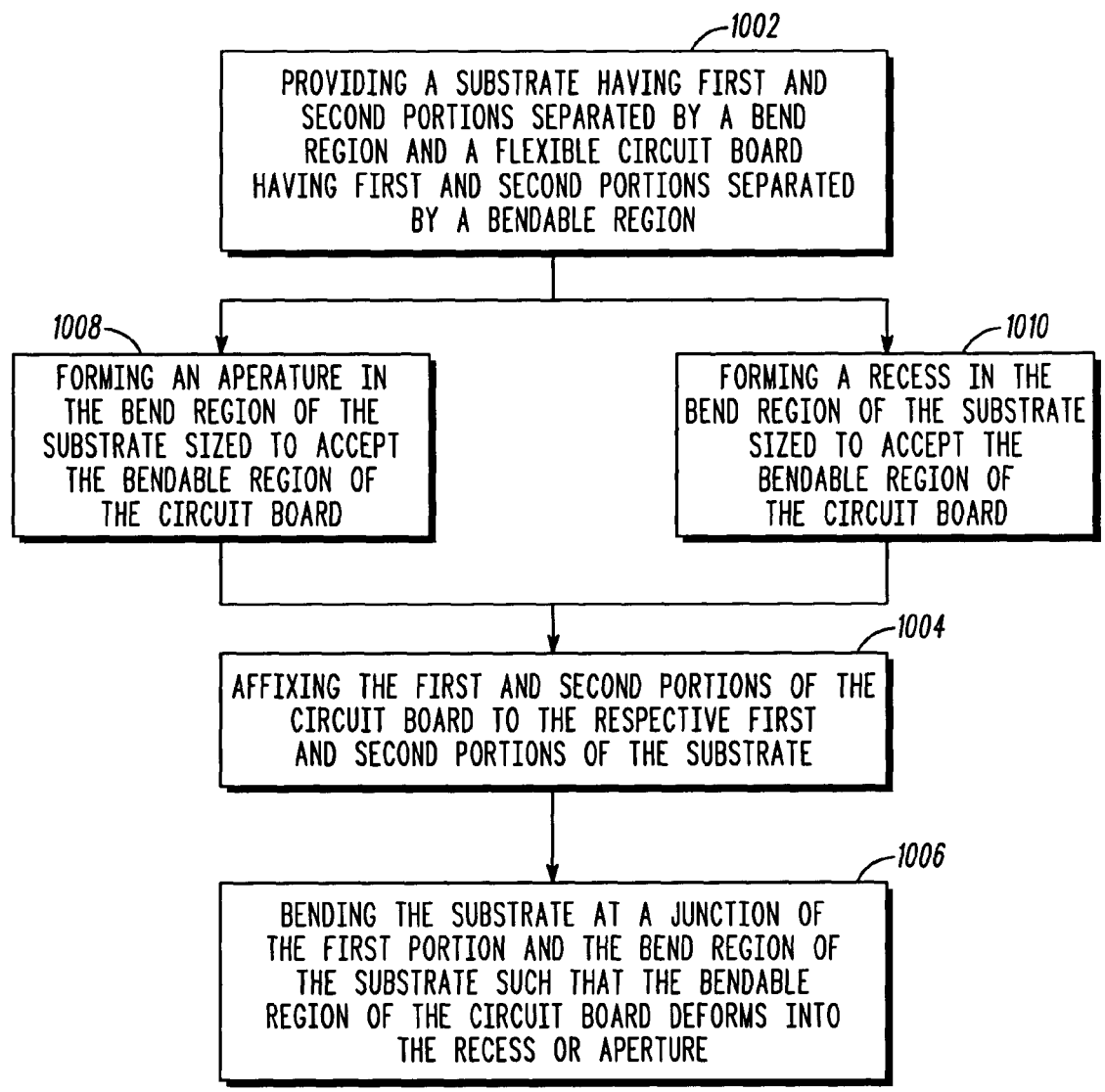
FIG. 10 is a logic flow diagram of a process of assembling an electronic control assembly that includes a rigidizer and a flexible circuit board in accordance with an embodiment of the present invention.

FIG. 10 is a logic flow diagram 1000 of a process of assembling an electronic control assembly that includes a rigidizer and a flexible circuit board in accordance with any of the embodiments of the present invention. Logic flow diagram 1000 begins by providing 1002 a substantially rigid substrate having a first portion and a second portion separated by a bend region and a flexible circuit board having a first portion and a second portion separated by a bendable region. Preferably, the providing step 1002 includes providing a multilayer circuit board composed of multiple layers of a glass weave impregnated with an epoxy resin formed with conductive traces, conductive vias, and conductive pads for securing and interconnecting electrical components thereto, and further comprising the step of solder reflowing components to the circuit board.

More preferably, the providing step 1002 includes providing the bend region with a ten millimeter width between the first and second portions of the rigidizer. Logic flow continues by affixing 1004 the first and second portions of the circuit board to the respective first and second portions of the substrate. This can include applying an adhesive to the rigidizer and mounting the circuit board flat on the adhesive and thereby on an inner surface of the rigidizer. The flexible circuit board and the rigidizer are then folded or bent 1006 at a junction of the first portion and the bend region of the substrate. Preferably the first and second portion of the rigidizer and circuit are bent such that the first and second portions of the circuit board and the substrate are bent at less than a one hundred eighty degree angle to each other as measured from the inside surface. More preferably, the rigidizer and circuit are bent such that the first and second portions of the circuit board and the substrate are bent at less than a ninety degree angle to each other as measured from the inside surface. In response to the folding of the flexible circuit board and the rigidizer, the bendable region of the folded flexible circuit board attains an 'L'-shape.

In one embodiment of the present invention, a further step includes the forming 1008 at least one aperture in the bend region of the rigidizer and further including a plurality of bridges that interconnect the first and second portions of the rigidizer across the bend region. In this case, the aperture is sized to accept the bendable region of the circuit board, such that in the bending step 1006 the bendable region of the circuit board deforms into the aperture(s) of the substrate to extend beyond an interior region of the rigidizer via the aperture(s), thereby facilitating an 'L'-shaped fold in the bendable region of the flexible circuit board. This embodiment may require a further step of mounting an end cap on the rigidizer over the aperture(s) and the portion of the flexible circuit board that extends outside of the aperture(s). In still another embodiment of the present invention, a connector that includes multiple pins is mounted on the rigidizer and electrically connects to the circuit board therethrough.

In a preferred embodiment of the present invention, a further step includes the forming 1010 at least one recess in the bend region of the rigidizer extending outwardly from the inner surface of the rigidizer to an outer surface thereof. In this case, the recess is sized to accept the bendable region of the circuit board, such that in the bending step 1006 the bendable region of the circuit board deforms into the recess of the substrate to extend beyond an interior region of the rigidizer via the recess, thereby facilitating an 'L'-shaped fold in the bendable region of the flexible circuit board. Preferably, the recess has a depth of five millimeters extending outwardly from the inner surface of the rigidizer.

By facilitating an L-shaped fold in the circuit board 304, as compared to the serpentine fold of circuit boards 104 of prior art electronic control unit 100, the electronic control units 300, 800 of the present invention permit a larger radius of curvature bend in a flexible circuit portion of circuit board 304 as compared to a radius of curvature bend in a similarly-sized electronic module 100. The larger radius of curvature bend greatly reduces the rate of splitting and cracking of the flexible circuit portion when circuit board 304 is bent. Moreover, the larger radius allows a lower overall profile of the electronic control units 300, 800 to be used by providing a bend region of the rigidizer having only a tem millimeter width.

While the present invention has been particularly shown and described with reference to particular embodiments thereof, it will be understood by those skilled in the art that various changes may be made and equivalents substituted for elements thereof without departing from the broad scope of the invention. In addition, many modifications may be made to adapt a particular situation or material to the teachings of the invention without departing from the essential scope thereof. Therefore, it is intended that the invention not be limited to the particular embodiments disclosed herein, but that the invention will include all embodiments falling within the scope of the appended claims.

What is claimed is:

1. An electronic control unit having a flexible circuit board assembly comprising:
   a flexible circuit board with at least one layer having a first portion and a second portion separated by a bendable region; and
   a substantially rigid substrate having a first portion and a second portion separated by a bend region, the rigid substrate having an inside surface and an outside surface, the first and second portions of the circuit board being affixed to the respective first and second portions of the substrate, the bend region having one of the group of a recess and aperture extending outwardly from the inside surface of the substrate with the one of the group of the recess and aperture sized to accept the bendable region of the circuit board,
   wherein the first and second portions of the circuit board and the substrate are bent at less than a one hundred eighty degree angle to each other as measured from the inside surface.

2. The control unit of claim 1, wherein the bendable region of the circuit board in the recess of the substrate has a single bend radius of no less than three millimeters.

3. The control unit of claim 1, wherein the bendable region of the circuit board in the recess of the substrate has a single bend radius of no less than five millimeters.

4. The control unit of claim 1, wherein the bend region of the substrate has a width between the first and second portions of no more than ten millimeters.

5. The control unit of claim 1, wherein the circuit board is a multilayer circuit board formed with conductive traces, conductive vias, and conductive pads for securing and interconnecting electrical components thereto.

6. The control unit of claim 1, wherein the circuit board is composed of multiple layers of a glass weave impregnated with an epoxy resin.

7. The control unit of claim 1, wherein the bend region is substantially coplanar with a longer of the first and second portions of the substrate.

8. An electronic control unit having a flexible circuit board assembly comprising:
   a flexible circuit board composed of multiple layers of a glass weave impregnated with an epoxy resin and having a first portion and a second portion separated by a bendable region, the circuit board being formed with conductive traces, conductive vias, and conductive pads for securing and interconnecting electrical components thereto; and
   a substantially rigid substrate having a first portion and a second portion separated by a bend region, the rigid substrate having an inside surface and an outside surface, the first and second portions of the circuit board being affixed to the respective first and second portions of the substrate, the bend region having a recess extending outwardly from the inside surface of the substrate with the recess sized to accept the bendable region of the circuit board, and
   the first and second portions of the circuit board and the substrate are bent at less than a one hundred eighty degree angle to each other as measured from the inside surface,
   wherein the first and second portions of the circuit board and the substrate are bent at approximately a ninety degree angle to each other as measured from the inside surface.

9. The control unit of claim 8, wherein the bendable region of the circuit board in the recess of the substrate has a single bend radius of no less than three millimeters.

10. The control unit of claim 8, wherein the bend region of the substrate has a width between the first and second portions of not more than ten millimeters.

11. The control unit of claim 8, wherein the bend region is substantially coplanar with a longer of the first and second portions of the substrate.

12. A method for forming a circuit board in an electronic control unit assembly, the method comprising the steps of:
   providing a substantially rigid substrate having a first portion and a second portion separated by a bend region and a flexible circuit board having a first portion and a second portion separated by a bendable region;
   forming a recess in the bend region of the substrate extending outwardly from an inside surface thereof with the recess sized to accept the bendable region of the circuit board;
   affixing the first and second portions of the circuit board to the respective first and second portions of the substrate; and
   bending the substrate at a junction of the first portion and the bend region of the substrate such that the bendable region of the circuit board deforms into the recess of the substrate.

13. The method of claim 12, wherein the bending step includes bending the substrate such that the first and second portions of the circuit board and the substrate are bent at less than a one hundred eighty degree angle to each other as measured from the inside surface.

14. The method of claim 12, wherein the bending step includes bending the substrate such that the bendable region of the circuit board in the recess of the substrate has a bend radius of no less than three millimeters.

15. The method of claim 12, wherein the providing step includes providing the bend region of the substrate with a width between the first and second portions of not more than ten millimeters.

16. The method of claim 12, wherein the providing step includes providing a multilayer circuit board composed of multiple layers of a glass weave impregnated with an epoxy resin formed with conductive traces, conductive vias, and conductive pads for securing and interconnecting electrical components thereto, and further comprising the step of solder reflowing components to the circuit board.

17. The method of claim 12, wherein the bending step includes bending the substrate such that the first and second portions of the circuit board and the substrate are bent at approximately a ninety degree angle to each other as measured from the inside surface.

18. The method of claim 12, wherein the affixing step includes the substeps of applying an adhesive to the inside surface of the flat substrate and mounting the flexible circuit board flat on the surface of the substrate.

* * * * *